(12) United States Patent
Chen

(10) Patent No.: US 9,391,629 B2
(45) Date of Patent: Jul. 12, 2016

(54) METHOD AND DEVICE FOR AUTO-CALIBRATION OF ADC

(71) Applicant: SHENZHEN SKYWORTH-RGB ELECTRONIC CO., LTD, Shenzhen, Guangdong (CN)

(72) Inventor: Hongbo Chen, Shenzhen (CN)

(73) Assignee: SHENZHEN SKYWORTH-RGB ELECTRONIC CO., LTD, Shenzhen (CN)

( * ) Notice: Subject to any disclaimer, the term of this patent is extended or adjusted under 35 U.S.C. 154(b) by 0 days.

(21) Appl. No.: 14/411,108

(22) PCT Filed: Aug. 20, 2013

(86) PCT No.: PCT/CN2013/081903
§ 371 (c)(1),
(2) Date: Dec. 24, 2014

(87) PCT Pub. No.: WO2015/007007
PCT Pub. Date: Jan. 22, 2015

(65) Prior Publication Data
US 2016/0072517 A1  Mar. 10, 2016

(30) Foreign Application Priority Data

Jul. 19, 2013 (CN) .......................... 2013 1 0306856

(51) Int. Cl.
*H03M 1/10* (2006.01)
*H03M 1/06* (2006.01)
*H03M 1/12* (2006.01)
*H03M 1/00* (2006.01)

(52) U.S. Cl.
CPC .......... *H03M 1/1033* (2013.01); *H03M 1/1057* (2013.01); *H03M 1/00* (2013.01); *H03M 1/0695* (2013.01); *H03M 1/12* (2013.01)

(58) Field of Classification Search
CPC ........ H03M 1/12; H03M 1/00; H03M 1/0695
USPC .......................... 341/120, 118, 155, 161, 162
See application file for complete search history.

(56) References Cited

U.S. PATENT DOCUMENTS 5,644,308 A * 7/1997 Kerth .................. H03M 1/0692
341/120

FOREIGN PATENT DOCUMENTS

| CN | 1777259 A | 5/2006 |
|---|---|---|
| CN | 101212562 A | 7/2008 |

OTHER PUBLICATIONS

International Search Report of PCT Patent Application No. PCT/CN2013/081903 issued on Mar. 20, 2014.

* cited by examiner

*Primary Examiner* — Joseph Lauture

(57) ABSTRACT

The present invention provides a method for auto-calibration of ADC, comprising acquiring a voltage signal value of a reference voltage source; converting the voltage signal value of the reference voltage source to a digital signal value according to a preset conversion coefficient value; and comparing the digital signal value to a target value and adjusting the conversion coefficient value according to the comparing result so that the difference between the digital signal value and the target value is within an allowed margin of error. The procedure of the method for auto-calibration of ADC of the present invention is executed automatically, no professional operator is needed to calibrate manually. As such, labor cost is reduced and work efficiency is improved.

15 Claims, 9 Drawing Sheets

METHOD AND DEVICE FOR AUTO-CALIBRATION OF ADC

BACKGROUND

1. Technical Field

The present invention relates in general to the field of television and, in particular, to a method and device for auto-calibration of analog-to digital converter (ADC).

2. Description of Related Art

In prior arts, televisions are equipped with computer channel and component channel, both of which process analog signal. When processing the two analog signals, three independent ADCs of the television are needed. That is, either processing the signal of the computer channel or processing the signal of the component channel, three ADCs are needed to work together.

During producing ADCs, due to technics, the converting performance of each ADC cannot be guaranteed to be exactly the same. Therefore, the analog to digital converting performances of the three independent ADCs in the television are not the same.

Under this circumstance, a procedure of calibrating the analog to digital converting performances of the ADCs in each television is required in the production line of the television. Operators usually use a computer and a signal generator to calibrate, which, however, result in the following disadvantages:

1. More operators are needed in the production line for calibration of the ADCs;
2. Signal generators are needed; and
3. Efficiency of the production line is lowered due to the calibration of the ADCs are time-costly.

BRIEF SUMMARY

To overcome the low efficiency and high cost drawbacks, the present invention provides a method and device for auto-calibration of ADC that is capable of automatic calibration.

The present invention provides a method for auto-calibration of ADC, comprising:

acquiring a voltage signal value of a reference voltage source;

converting the voltage signal value of the reference voltage source to a digital signal value according to a preset conversion coefficient value;

comparing the digital signal value to a target value and adjusting the conversion coefficient value according to the comparing result so that the difference between the digital signal value and the target value is within an allowed margin of error.

Preferably, after the step of comparing the digital signal value to a target value and adjusting the conversion coefficient value according to the comparing result so that the difference between the digital signal value and the target value is within an allowed margin of error, further comprises:

saving the adjusted conversion coefficient value at a specified position of a memory, the adjusted conversion coefficient value being configured for being directly called during the digital conversion operation of the ADC Preferably, the step of converting the voltage signal value of the reference voltage source to a digital signal value according to a preset conversion coefficient value specifically comprising:

the preset conversion coefficient value including a bias coefficient value and a gain coefficient value, converting the voltage signal value of the reference voltage source to the digital signal value according to the bias coefficient value and gain coefficient value, the conversion relation between the digital signal value and the voltage signal value being: (digital signal value)=(voltage signal value)*(gain coefficient value)+(gain coefficient value); and adjusting the conversion coefficient value specifically comprises adjusting the gain coefficient value.

Preferably, the step of comparing the digital signal value to a target value and adjusting the conversion coefficient value according to the comparing result so that the difference between the digital signal value and the target value is within an allowed margin of error comprises:

acquiring the difference between the digital signal value and target value; and determining whether the difference is greater than the maximum of allowed margin of error when the absolute value of the difference is greater than the absolute value of the allowed margin of error, if yet, lessening the gain coefficient value, otherwise, increasing the gain coefficient value.

Preferably, wherein before the step of acquiring a voltage signal value of a reference voltage source, further comprises:

determining a channel type of an analog signal received by the ADC and a calibration status when the ADC is processing analog signal of said channel type.

Preferably, the step of determining a channel type of an analog signal received by the ADC and a calibration status when the ADC is processing analog signal of said channel type comprises:

arranging a specified position of a memory that corresponds to each channel type, and setting the value of 0 or 1 of the specified position to be a digital ID which corresponds to the status before and after calibration of the ADC when it is processing the analog signal in the current channel type; and reading the specified position of the memory and determining the current channel type according to the specified position; and reading the digital ID at the specified position and determining the calibration status of the ADC when it is processing the analog signal of the current channel type.

Preferably, before the step of saving the adjusted conversion coefficient value at a specified position of a memory, further comprises:

regenerating the digital ID at the specified position that corresponds to a current channel type, the regenerated digital ID corresponding to the status of the ADC which has been calibrated when it is processing the analog signal of the current channel type.

Preferably, the step of saving the adjusted conversion coefficient value at a specified position of a memory comprises:

arranging a specified position of a memory that corresponds to each channel type; corresponding to current channel type, saving the adjusted gain coefficient value to the specified position of a memory, the gain coefficient value at the specified position being configured for being directly called during the digital conversion operation of the ADC.

The present invention further comprises a device for auto-calibration of ADC, comprising a reference voltage source setting module and a ADC, the ADC comprising a parameter setting module, a signal converting module, and an adjusting module, the reference voltage source setting module, parameter setting module, signal converting module, and adjusting module being connected to each other in serial, wherein the reference voltage source setting module is configured for providing a reference voltage source to the ADC;

the parameter setting module is configured for presetting a conversion coefficient value, a target value and a allowed margin of error;

the signal converting module is configured for acquiring a voltage signal value of the reference voltage source and converting the voltage signal value of the reference voltage source to a digital signal value according to a preset conversion coefficient value;

The adjusting module is configured for comparing the digital signal value to the target value and adjusting the conversion coefficient value according to the comparing result so that the difference between the digital signal value and the target value is within the allowed margin of error.

Preferably, the device further comprises a memory module connected to the adjusting module, wherein the memory module is configured for saving the adjusted conversion coefficient value at a specified position thereof, the adjusted conversion coefficient value being configured for being directly called during the digital conversion operation of the ADC.

Preferably, the adjusting module is configured for presetting the bias coefficient value and gain coefficient value of the conversion coefficient value;

the signal converting module is configure for converting the voltage signal value of the reference voltage source setting module to the digital signal value according to the bias coefficient value and gain coefficient value, the conversion relation between the digital signal value and the voltage signal value being: (digital signal value)=(voltage signal value)*(gain coefficient value)+(gain coefficient value); and the adjusting module adjusting the conversion coefficient specifically comprises adjusting the gain coefficient value.

Preferably, the adjusting module is configure for acquiring the difference between the digital signal value and target value; and determining whether the difference is greater than the maximum of allowed margin of error when the absolute value of the difference is greater than the absolute value of the allowed margin of error, if yet, lessening the gain coefficient value, otherwise, increasing the gain coefficient value.

Preferably, the device of further comprises a channel type identifying module which is connected to the parameter setting module, wherein the channel type identifying module is configured for determining a channel type of an analog signal received by the ADC and a calibration status when the ADC is processing analog signal of said channel type.

Preferably, the memory module is connected to the channel type adjusting module;

the memory module is configure for arranging a specified position of a memory that corresponds to each channel type, and setting the value of 0 or 1 of the specified position to be a digital ID which corresponds to the status before and after calibration of the ADC when it is processing the analog signal in the current channel type; and the channel type adjusting module is configure for reading the specified position of the memory and determining the current channel type according to the specified position; and reading the digital ID at the specified position and determining the calibration status of the ADC when it is processing the analog signal of the current channel type.

Preferably, the memory module is further configured for regenerating the digital ID at the specified position that corresponds to a current channel type, the regenerated digital ID corresponding to the status of the ADC which has been calibrated when it is processing the analog signal of the current channel type.

Preferably, the memory module is further configured for arranging a specified position of a memory that corresponds to each channel type; corresponding to current channel type, saving the adjusted gain coefficient value to the specified position of a memory, the gain coefficient value at the specified position being configured for being directly called during the digital conversion operation of the ADC.

The present invention provides a method for auto-calibration of ADC, by arranging an adjustable reference voltage source inside a video chip, when the reference voltage source is connected to the ADC, the system will calculate the target value where an analog signal value is converted to a digital signal value according to default parameters. Further, the converted digital value is compared to the target value and the related conversion coefficient value of the ADC is adjusted so that the difference between the digital signal value and the target value is within the allowed margin of error. The conversion coefficient value is determined and saved at a specified position of a memory. When the ADC is dealing with analog signals of deferent channel types, the system reads the digital ID at the specified position and determining the whether the ADC has been calibrated when it is processing the analog signal of the current channel type. If calibrated, the conversion coefficient value of corresponding channel type can be directly called at the specified position of the memory and the digitally conversion is finished. The present invention has the following advantages: the procedure of the method for calibration of ADC of the present invention is executed automatically, no professional operator is needed to calibrate manually. As such, labor cost is reduced and work efficiency is improved. The present invention further provides a device for auto-calibration of ADC that corresponds to the above method for auto-calibration of ADC.

DETAILED DESCRIPTION

Technical solutions of the present invention will be described in detail with reference to embodiments and attached drawings. It should be understood that the embodiments described below are just for explain the present invention, without any limitation of the present invention.

The present invention provides a method for auto-calibration of ADC, by arranging an adjustable reference voltage source inside a video chip, when the reference voltage source is connected to the ADC, the system will calculate the target value where an analog signal value is converted to a digital signal value according to default parameters. Further, the converted digital value is compared to the target value and the related conversion coefficient value of the ADC is adjusted so that the difference between the digital signal value and the target value is within the allowed margin of error. The conversion coefficient value is determined and saved at a specified position of a memory. When the ADC is dealing with analog signals of deferent channel types, the system reads the digital ID at the specified position and determining the whether the ADC has been calibrated when it is processing the analog signal of the current channel type. If calibrated, the conversion coefficient value of corresponding channel type can be directly called at the specified position of the memory and the digitally conversion is finished. The present invention has the following advantages: the procedure of the method for auto-calibration of ADC of the present invention is executed automatically, no professional operator is needed to calibrate manually. As such, labor cost is reduced and work efficiency is improved. The present invention further provides a device for auto-calibration of ADC that corresponds to the above method for auto-calibration of ADC.

Figure 1:
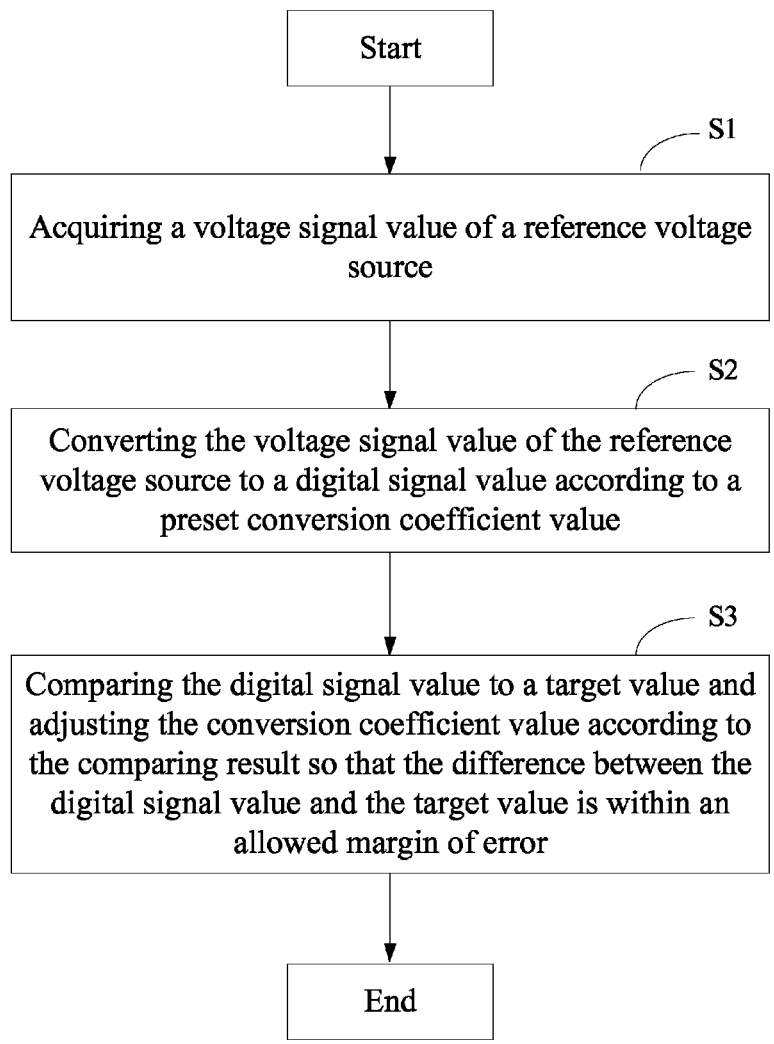
FIG. 1 is a flow chart showing a method for auto-calibration of ADC according to a first embodiment of the present invention.

Referring to FIG. 1, it is a flow chart showing a method for auto-calibration of ADC according to a first embodiment of the present invention. The method for auto-calibration of ADC according to this embodiment includes the following steps:

S1: Acquiring a voltage signal value of a reference voltage source;

In step S1, the reference voltage source is arranged inside a video chip and can be adjusted through register of the chip.

In addition, the reference voltage source and the ADC can be connected to each other through a switch. Before the ADC is calibrated, the switch can be turned on so that the ADC is connected to the reference voltage source to acquire the voltage signal thereof.

S2: Converting the voltage signal value of the reference voltage source to a digital signal value according to a preset conversion coefficient value;

In step S2, the principle of the conversion coefficient value of the ADC is a conversion relation or function for converting the voltage signal value of the reference voltage source to the digital signal value. The digital signal value converted from the voltage signal value of the reference voltage source according to the preset conversion coefficient value by the ADC is the actual converted value.

S3: Comparing the digital signal value to a target value and adjusting the conversion coefficient value according to the comparing result so that the difference between the digital signal value and the target value is within an allowed margin of error.

In step S3, the target value (ADC_Target) is the theoretical value of the voltage value of the reference voltage source after a digital conversion executed by the ADC.

The allowed margin of error (ADC_Margin) is the tolerance or allowed value between the target value (ADC_Target) and the actual value of the digital signal value which is converted from the voltage signal value by the ADC according to the conversion coefficient value.

Acquiring a difference (ADC_Diff) between the digital signal value and the target value in step S2, that is, ADC_Diff=ADC_Value−ADC_Target, comparing the difference and the allowed margin of error to get a second difference, and further judging whether the second difference is within the allowed margin of error. If yes, no calibration is needed. If no, the value or the function of the conversion coefficient value is adjusted automatically till the second difference is within the allowed margin of error.

During practical application of the present invention, the conversion coefficient value and allowed margin of error both can either be default values when the ADC has been produced, or preset values the system defining for the ADC, and the target value (ADC_Target) is preset according to the voltage signal value of the reference voltage source in the system. That is, when the voltage signal value of the reference voltage source is determined, the ADC automatically generates the target value (ADC_Target). Thus, varies parameters of the ADC are automatically generated or preset. Further, the reference voltage source can also be preset in the system.

When calibration to the ADC is needed, just connect the reference voltage source to the ADC, the system can automatically calibrate the ADC, no more manual calibration executed by operators on the computer and signal generator is needed. Thus, not only labor and material are reduced, but also the calibration efficiency of the ADC is improved.

Figure 2:
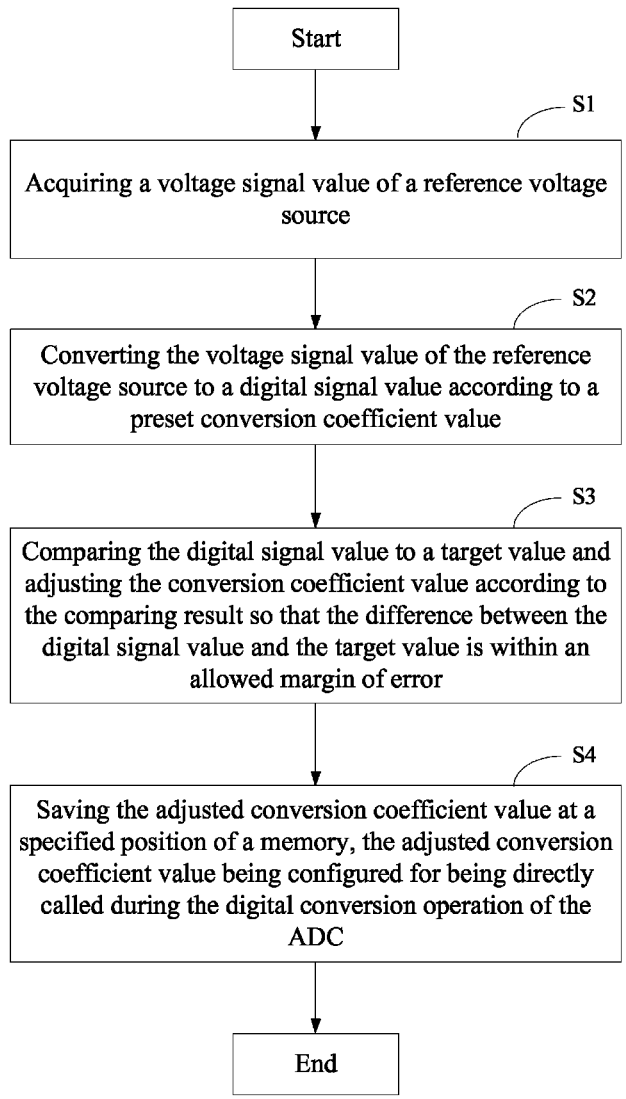
FIG. 2 is a flow chart showing a method for auto-calibration of ADC according to a second embodiment of the present invention.

Referring to FIG. 2, it is a flow chart showing a method for auto-calibration of ADC according to a second embodiment of the present invention.

More specifically, the following step is further included after step S3:

S4: Saving the adjusted conversion coefficient value at a specified position of a memory, the adjusted conversion coefficient value being configured for being directly called during the digital conversion operation of the ADC.

In step S4, to avoid the situation that the conversion coefficient value is lost due to power outage, the adjusted conversion coefficient value is saved at the specified position of the memory. The system set the process that when power is on, the ADC call the conversion coefficient value which is stored at the specified position of the memory directly.

The step S2 can more specifically be:

The preset conversion coefficient value including a bias coefficient value and a gain coefficient value, converting the voltage signal value of the reference voltage source to the digital signal value according to the bias coefficient value and gain coefficient value, the conversion relation between the digital signal value and the voltage signal value being: (digital signal value)=(voltage signal value)*(gain coefficient value)+(gain coefficient value).

In step S2 of the present embodiment, the conversion coefficient value includes the bias coefficient value and the gain coefficient value. The relation between the digital signal value and the voltage signal value is that: [digital signal value(ADC_Value)]=[voltage signal value]*[gain coefficient value (ADC_Gain)]+[gain coefficient value (ADC_Offset)]. The bias coefficient value, the gain coefficient value, and the function therebetween can either be default values when the ADC has been produced, or preset values the system defining for the ADC.

Further, the step S3 can more specifically be:

Comparing the digital signal value to the target value and adjusting the gain coefficient value according to the comparing result so that the difference between the digital signal value and the target value is within an allowed margin of error.

In the present embodiment, the conversion coefficient value includes the bias coefficient value and the gain coefficient value. During practical application, any one or both of the bias coefficient value and the gain coefficient value can be adjusted. To reduce the calculation of the chip of the ADC or the complication of the program of the system, in the embodiment of the present application, relation between the digital signal value and the voltage signal value is simplified due to that only the gain coefficient value is adjusted, which also facilitates the set of the program and the calculation of the chip.

Figure 3:
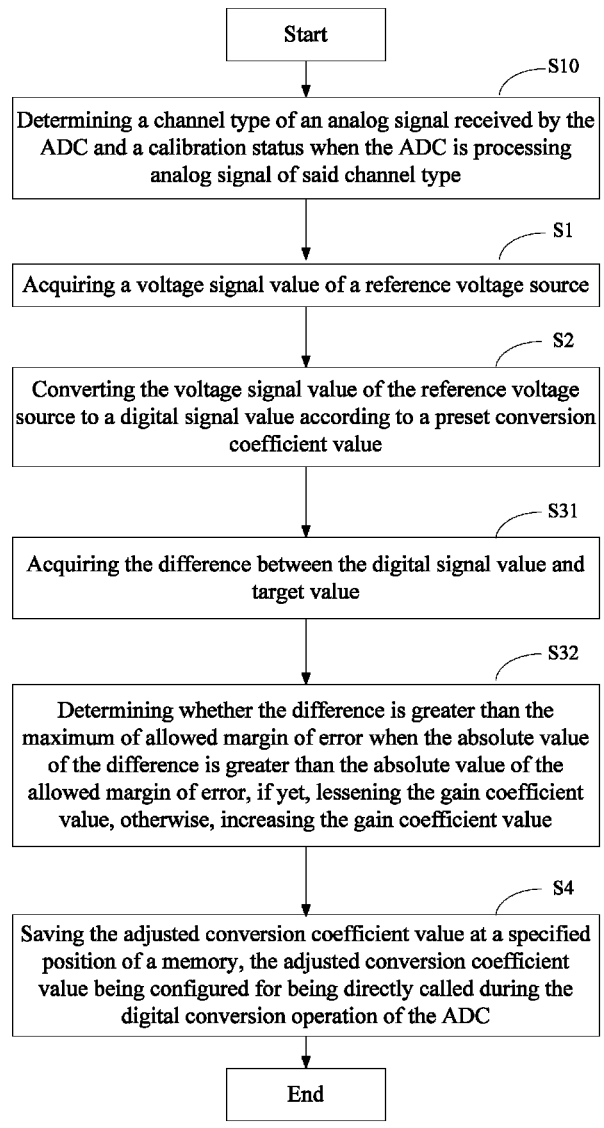
FIG. 3 is a flow chart showing a method for auto-calibration of ADC according to a third embodiment of the present invention.

Referring to FIG. 3, it is a flow chart showing a method for auto-calibration of ADC according to a third embodiment of the present invention.

More specifically, the step S3 includes the following steps:

S31: Acquiring the difference between the digital signal value and target value; and S32: Determining whether the difference is greater than the maximum of allowed margin of error when the absolute value of the difference is greater than the absolute value of the allowed margin of error, if yet, lessening the gain coefficient value, otherwise, increasing the gain coefficient value.

In step S32, if it is determined that the absolute value of the difference is smaller than the absolute value of the allowed margin of error, adjust to the gain coefficient value is terminated. For example, when the target value is 5, the digital signal value is 7, and the allowed margin of error is (−1, 1), the difference is 2, the absolute value of the difference is also 2, which is beyond the allowed margin of error and greater than the maximum of the allowed margin of error. In this case, the gain coefficient value should be lessened so that the digital signal value 7 gets close to the target value 5 so that the difference will be within the allowed margin of error. When the target value is 5, the digital signal value is 3, and the allowed margin of error is (−1, 1), the difference is −2, the absolute value of the difference is 2, which is beyond the allowed margin of error but smaller than the maximum of the allowed margin of error. In this case, the gain coefficient value should be increased so that the digital signal value 3 gets close to the target value 5 so that the difference will be within the allowed margin of error. Further, in the present embodiment, the gain coefficient value is selected to the adjusting subject, this simplifies the relation between the digital signal value and the voltage signal value and optimizes the program of the system.

More specifically, to support the calibration need to the ADC in complicated situation, in the present embodiment, the following step is further included before the step S1:

S10: determining a channel type of an analog signal received by the ADC and a calibration status when the ADC is processing analog signal of said channel type.

In step S10, the channel type can be one or more. Further, the number of the ADC that is processing the analog signal of the present channel type can be one or more, determined by actual need.

For different channel types of the analog signals need to be processed, the calibration to related parameters corresponding to each type of channel of the ADC is different.

During practical application of the step S10, for example, in television manufacturing field, the television includes a computer channel and a component channel. Each of the channels needs an ADC module which includes three independent ADCs for processing. Each of the ADCs of the ADC module has to be connected to a reference voltage source. That is, when the ADC module is processing the analog signal in the computer channel, each of the ADCs of the ADC module has to be calibrated, which is briefly called ADC calibration of the computer channel; and when processing the analog signal in the component channel, each of the ADCs of the ADC module has to be calibrated, which is briefly called ADC calibration of the component channel. The above two calibrations do not affect each other, however, after the two calibrations, analog signals in both the computer channel and component channel processed by the ADC module can produce substantially the same picture quality of picture in the computer channel and the component channel.

It should be point out that, during each calibration, the three ADCs of the ADC module are connected to an individual reference voltage source. That means, during each calibration, the three ADCs of the ADC module have to be calibrated. Parameters of each of the three ADCs are not necessarily the same as long as the ADC module can perform the goal and effect of calibration.

Figure 4:
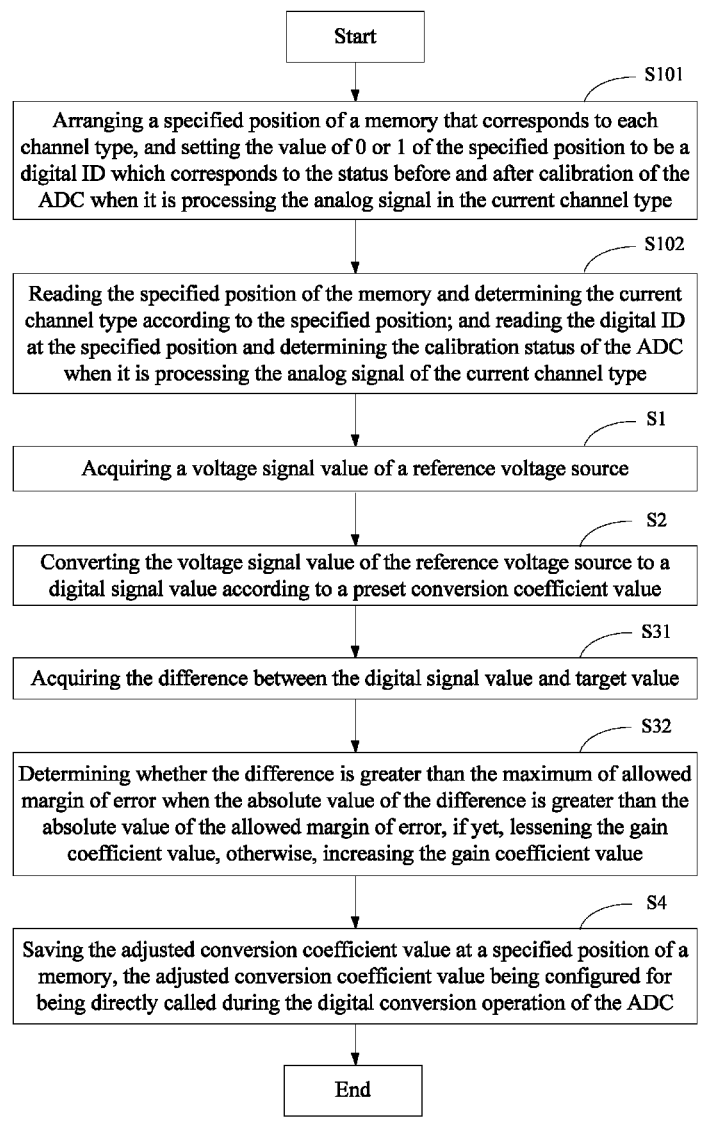
FIG. 4 is a flow chart showing a method for auto-calibration of ADC according to a fourth embodiment of the present invention.

Referring to FIG. 4, it is a flow chart showing a method for auto-calibration of ADC according to a fourth embodiment of the present invention.

In further embodiment, to enable the system to automatically identify and determine the calibration status of the ADC and avoid automatic calibration, in the present embodiment, the step S10 includes the above specific steps:

S101: Arranging a specified position of a memory that corresponds to each channel type, and setting the value of 0 or 1 of the specified position to be a digital ID which corresponds to the status before and after calibration of the ADC when it is processing the analog signal in the current channel type.

In step S101, if the channel type includes channel type 1 and channel type 2, then a corresponding specified position 1 and specified position 2 are arranged in the memory. When the ADC is processing the analog signal of the channel type 1, if the ADC does not calibrate, the system sets the digital ID at the specified position 1 to be 0; and if the ADC has calibrated, the system sets the digital ID at the specified position 1 to be 1. Similarly, when the ADC is processing the analog signal of the channel type 2, if the ADC does not calibrate, the system sets the digital ID at the specified position 2 to be 0; and if the ADC has calibrated, the system sets the digital ID at the specified position 2 to be 1.

S102: Reading the specified position of the memory and determining the current channel type according to the specified position; and reading the digital ID at the specified position and determining the calibration status of the ADC when it is processing the analog signal of the current channel type.

In step S102, the system reads the specified position of the memory and in practical application, the system should read the specified position of the memory in order. For example, the system reads the specified position 1 first and when it reads that the digital ID of the specified position 1 to be 0, the system determines that the ADC is not calibrated when it is processing the analog signal of the channel type 1. Then, according to the determining result, it is turned to step S2 to finish the calibration of the ADC. If the system reads the specified position 1 and it reads that the digital ID of the specified position 1 to be 1, the system determines that the ADC is calibrated when it is processing the analog signal of the channel type 1. After that, the system reads the next specified position 2 and reads the digital ID of the specified position 2. The following steps are similar to the above description of specified position 1 and will not be described again here.

Figure 5:
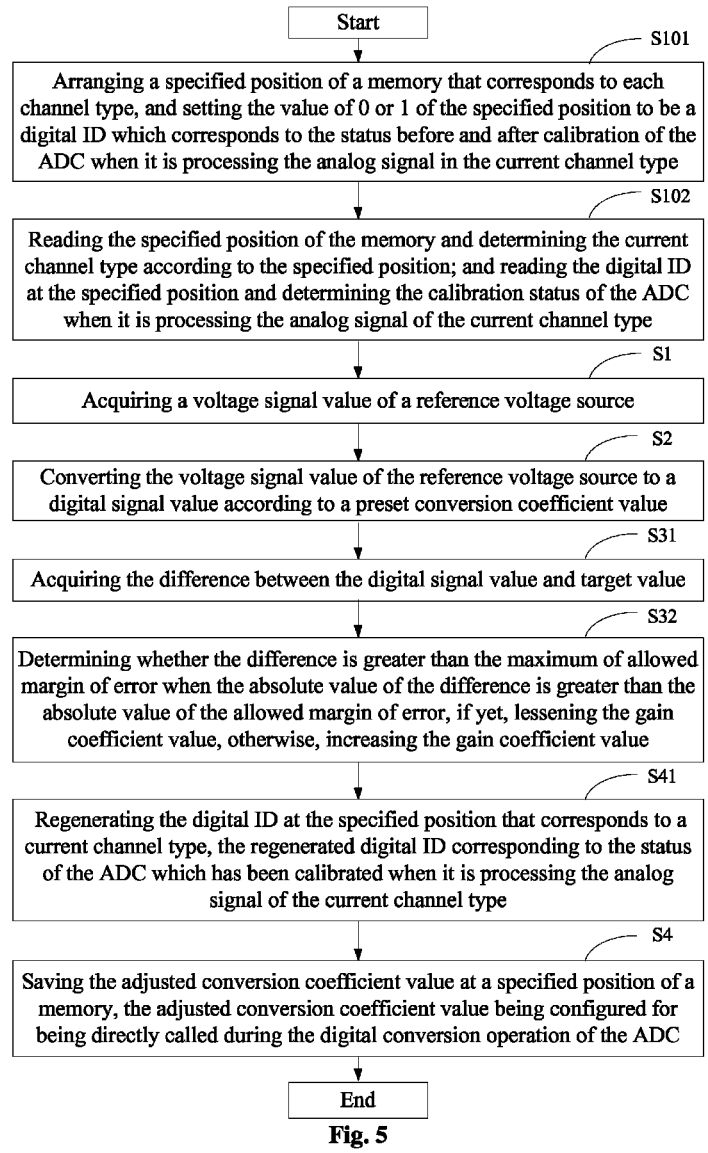
FIG. 5 is a flow chart showing a method for auto-calibration of ADC according to a fifth embodiment of the present invention.

Referring to FIG. 5, it is a flow chart showing a method for auto-calibration of ADC according to a fifth embodiment of the present invention.

More specifically, the following step is further included before step S4:

S41: Regenerating the digital ID at the specified position that corresponds to a current channel type, the regenerated digital ID corresponding to the status of the ADC which has been calibrated when it is processing the analog signal of the current channel type.

In step S41, if the ADC which is processing the analog signal of the channel type 1 has been calibrated, then the value 0 of the digital ID of the specified position 1 is set to be 1. If the system reads that the digital ID of the specified position is 1, it is then determined that when processing the analog signal of the channel type 1, the ADC has been calibrated. The system proceed to read the digital ID of the specified position 2, if the digital ID is 0, it means that when processing the analog signal of the channel type 2, the ADC has not been calibrated, the system then executes the steps S2 to S4. And further after the ADC has been calibrated when it is processing the analog signal of the channel type 2, the system sets the digital ID of the specified position 2 to be 1.

When the system has read that the value of the digital ID is 1 at all the specified positions 1 and 2, it means that the ADC has been calibrated.

The step S4 can more specifically be:

Arranging a specified position of a memory that corresponds to each channel type; corresponding to current channel type, saving the adjusted gain coefficient value to the specified position of a memory, the gain coefficient value at the specified position being configured for being directly called during the digital conversion operation of the ADC.

In the step S4 of the present embodiment, as the ADC achieves the auto-calibration by way of adjusting the gain coefficient value, it only needs to save the adjusted gain coefficient value at the specified position of the memory. When the system reads the specified position and the digital ID therein of the memory and determines that the ADC has been calibrated, the ADC calls the gain coefficient value at the specified position directed and finishes the digital signal conversion in corresponding channel type according to the gain coefficient value.

In practical application of the present invention, the channel type can be one or more, and the specified position set in the memory can also be one or more.

In the present embodiment, take television for example, the television includes a component channel and a computer channel. The memory provides a specified position 1 that corresponds to the component channel and a specified position 2 that corresponds to the computer channel. The value 0 and 1 of the specified position 1 correspond respectively to the non-calibrated and calibrated status of digital ID of the ADC when it processes analog signal of the component channel. The value 0 and 1 of the specified position 2 correspond respectively to the non-calibrated and calibrated status of digital ID of the ADC when it processes analog signal of the computer channel.

The automat calibration process of the television includes the following specific steps:

(1) Reading the digital ID at the specified position 1 of the memory, if the value is 0, determining the ADC of the component channel has not been calibrated;

(2) The system sets the voltage values of the three reference voltage source of the video chip to be 525 mV, 262.5 mV, and 262.5 mV through resistors;

(3) Turing on the connecting switches connected between the three reference voltages and the ADC_Offset module of the three ADCs;

(4) Setting the value of the the ADC_Offset modules of the ADCs to be 16, 128, and 128, setting the values of the ADC_Target of the three ADCs to be 235, 212, and 212; setting the value of the ADC_Gain of the three ADCs to be 128; and setting the value of the ADC_Margin of the three ADCs to be ±3;

(5) Reading the three values of the ADC_Value which is digitally converted from the three reference voltage by the three ADC, and calculating the difference ADC_Diff between the value of the ADC_Value and the ADC_Target of each ADC;

(6) Determining whether the absolute value of the ADC_Diff of each ADC is greater than the absolute value of the ADC_Margin of this ADC, that is, whether greater than 3; if yes, proceeding to determine the value of the ADC_Diff is greater than the maximum of the ADC_Margin, if yes, decreasing the value of the ADC_Gain; if no, increasing the value of the ADC_Gain; and then rereading the ADC_Value and making comparison loop;

(7) Determining that the absolute value of the ADC_Diff of each ADC is greater than the absolute value of the ADC_Margin of this ADC, and stop calibrating the value of the ADC_Gain so as to finish the component channel calibration of the three ADCs of the ADC module;

(8) Turning off the connecting switches connected between the three reference voltages and the ADC_Offset module after the success of calibration of the component channel of the ADC, adjusting the value 0 of the digital ID at the specified position 1 to be 1, and saving the adjusted value of the ADC_Gain at a specified position A of the memory; wherein, it should be noted that, the three ADCs of the ADC module individually have a value of ADC_Gain saved at the specified position A, or A1, A2, and A3.

Similarly, in the present invention, the ADC module of the computer channel can also be automatically calibrated, the value 0 of the digital ID at the specified position 2 is adjusted to be 1, and the adjusted value of the ADC_Gain is saved at a specified position B of the memory.

After the calibration, when the television is opened again, the system will read the value of 1 saved at the specified position 1 of the memory, judge whether the ADC module of the component channel has been calibrated, and read the value of the ADC_Gain saved at the specified position A of the memory. The ADC module executes the digital conversion of the analog signal of the component channel according to the value of the ADC_Gain. After that, the system will read the value of 1 saved at the specified position 2 of the memory, judge whether the ADC module of the computer channel has been calibrated, and read the value of the ADC_Gain saved at the specified position B of the memory. The ADC module executes the digital conversion of the analog signal of the computer channel according to the value of the ADC_Gain.

Finally, on the basis that the calibration performance is not affected, the calibration of the ADC is automatically finished through the first open of the television. After that, the system will enter the component channel and the computer channel. It is only needed to call the gain coefficient value saved at the specified positions A and B of the memory to perform automatic calibration. Thus, no more manual calibration executed by operators on the computer and signal generator is needed. Thus, calibration efficiency is improved and cost is reduced. Further, the picture displayed in television has substantially the same picture quality in the computer channel and the component channel.

Figure 6:
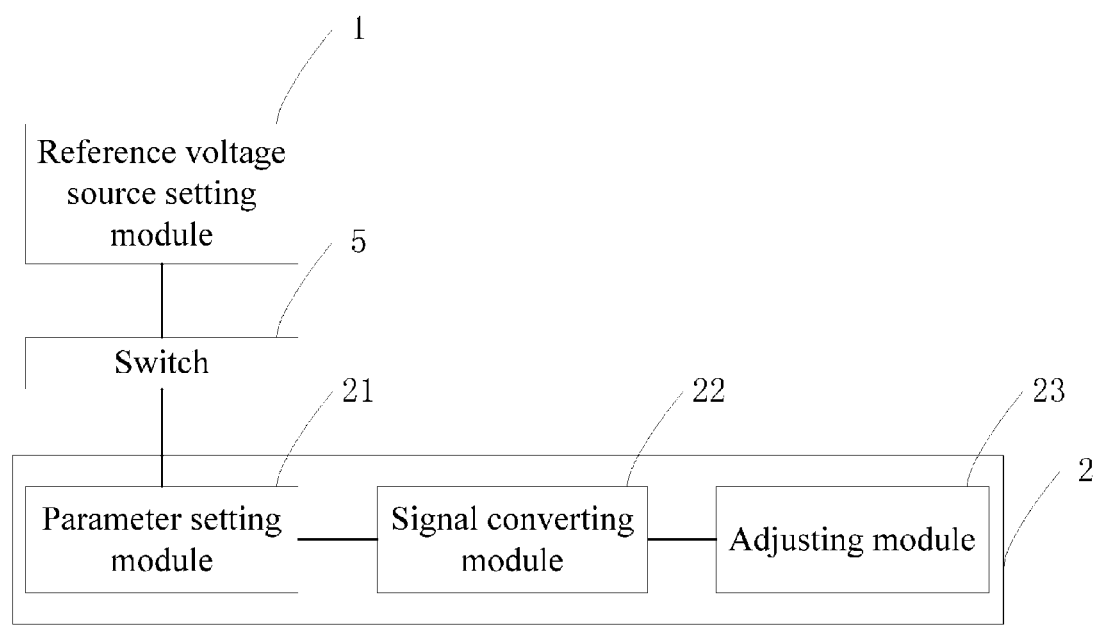
FIG. 6 is a block diagram showing a device for auto-calibration of ADC according to a first embodiment of the present invention.

Referring to FIG. 6, it is a block diagram showing a device for auto-calibration of ADC according to a first embodiment of the present invention.

The present invention further provides a device for auto-calibration of ADC, which includes a reference voltage source setting module 1 and an ADC 2. The ADC 2 includes a parameter setting module 21, a signal converting module 22, and an adjusting module 23. The reference voltage source setting module 1, parameter setting module 21, signal converting module 22, and adjusting module 23 connected to each other in serial.

The reference voltage source setting module 1 is configured for providing a reference voltage source to the ADC 2. The parameter setting module 21 is configured for presetting a conversion coefficient value, a target value and a allowed margin of error. The signal converting module 22 is configured for acquiring a voltage signal value of the reference voltage source and converting the voltage signal value of the reference voltage source to a digital signal value according to a preset conversion coefficient value. The adjusting module 23 is configured for comparing the digital signal value to the target value and adjusting the conversion coefficient value according to the comparing result so that the difference between the digital signal value and the target value is within the allowed margin of error.

In the embodiment of the present invention, the reference voltage source setting module 1 and the ADC 2 can be connected to each other through a switch 5. Before the ADC 2 is calibrated, the switch 5 can be turned on so that the ADC 2 is connected to the reference voltage source setting module 1 to acquire the voltage signal thereof.

In addition, the principle of the conversion coefficient value preset inside the parameter setting module 21 is a conversion relation or function for converting the voltage signal value of the reference voltage source of the reference voltage source setting module 1 to the digital signal value. The digital signal value converted from the voltage signal value of the reference voltage source according to the preset conversion coefficient value of the parameter setting module 21 by the signal converting module 22 is the actual converted value.

The target value (ADC_Target) preset inside the parameter setting module 21 is the theoretical value of the voltage value of the reference voltage source after a digital conversion executed by the signal converting module 22.

The allowed margin of error (ADC_Margin) preset inside the parameter setting module 21 is the tolerance or allowed value between the target value (ADC_Target) and the actual value of the digital signal value which is converted from the voltage signal value by the signal converting module 22 according to the conversion coefficient value.

The adjusting module 23 acquires a difference (ADC_Diff) between the digital signal value and the target value, that is, ADC_Diff=ADC_Value−ADC_Target, compares the difference and the allowed margin of error to get a second difference, and further judges whether the second difference is within the allowed margin of error. If yes, no calibration is needed. If no, the value or the function of the conversion coefficient value is adjusted automatically till the second difference is within the allowed margin of error.

During practical application of the present invention, the conversion coefficient value and allowed margin of error in the parameter setting module 21 both can either be default values when the ADC has been produced, or preset values the system defining for the ADC, and the target value (ADC_Target) of the parameter setting module 21 is preset according to the voltage signal value of the reference voltage source setting module 1. That is, when the voltage signal value of the reference voltage source is determined, the parameter setting module 21 automatically generates the target value (ADC_Target). Thus, varies parameters of the ADC are automatically generated or preset. Further, the reference voltage source setting module 1 can be preset inside a video chip and adjusted through a resistor. The voltage signal value of the reference voltage source setting module 1 can also be preset in the system.

When calibration to the ADC 2 is needed, just connect the reference voltage source setting module 1 to the ADC 2, the system can automatically calibrate the ADC 2, and no more manual calibration executed by operators on the computer and signal generator is needed. Thus, not only labor and material are reduced, but also the calibration efficiency of the ADC 2 is improved.

Figure 7:
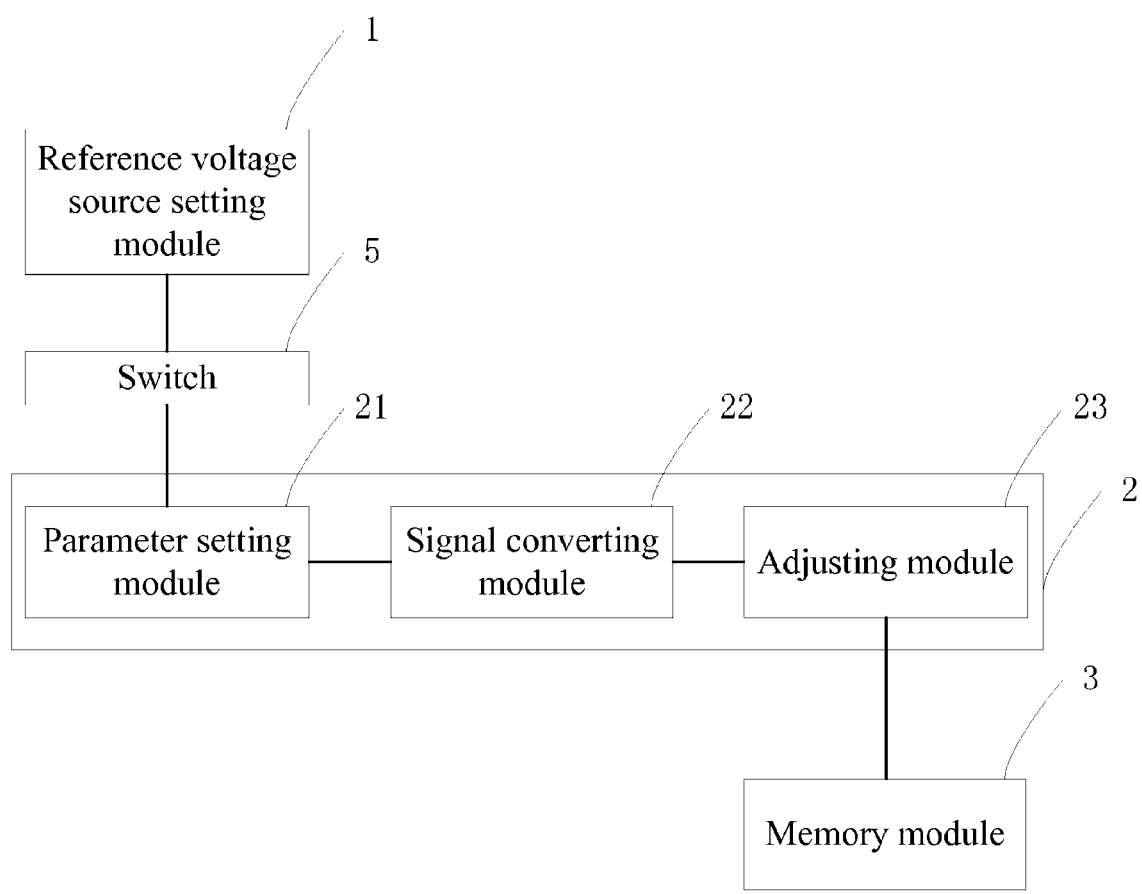
FIG. 7 is a block diagram showing a device for auto-calibration of ADC according to a second embodiment of the present invention.

Referring to FIG. 7, it is a block diagram showing a device for auto-calibration of ADC according to a second embodiment of the present invention.

More specifically, the device for auto-calibration of ADC further includes a memory module 3 which is connected to the adjusting module 23.

The memory module 3 is configured for saving the adjusted conversion coefficient value at a specified position thereof, the adjusted conversion coefficient value being configured for being directly called during the digital conversion operation of the ADC 2.

The preset conversion coefficient value including a bias coefficient value and a gain coefficient value, wherein the adjusting module 23 is configured for presetting the bias coefficient value and gain coefficient value of the conversion coefficient value.

The signal converting module 22 is configure for converting the voltage signal value of the reference voltage source setting module 1 to the digital signal value according to the bias coefficient value and gain coefficient value, wherein the conversion relation between the digital signal value and the voltage signal value is: (digital signal value)=(voltage signal value)*(gain coefficient value)+(gain coefficient value).

The adjusting module 23 is configured for comparing the digital signal value to the target value and adjusting the gain coefficient value according to the comparing result so that the difference between the digital signal value and the target value is within an allowed margin of error.

In the embodiment of the present invention, the conversion coefficient value includes the bias coefficient value and the gain coefficient value. The relation between the digital signal value and the voltage signal value is that: [digital signal value(ADC_Value)]=[voltage signal value]*[gain coefficient value (ADC_Gain)]+[gain coefficient value (ADC_Offset)]. The bias coefficient value, the gain coefficient value, and the function therebetween can either be default values when the ADC has been produced, or preset values the system defining for the parameter setting module 21.

In addition, during practical application, any one or both of the bias coefficient value and the gain coefficient value can be adjusted. To reduce the calculation of the chip of the ADC or the complication of the program of the system, in the embodiment of the present application, relation between the digital signal value and the voltage signal value is simplified due to that only the gain coefficient value is adjusted, which also facilitates the set of the program and the calculation of the chip.

Figure 8:
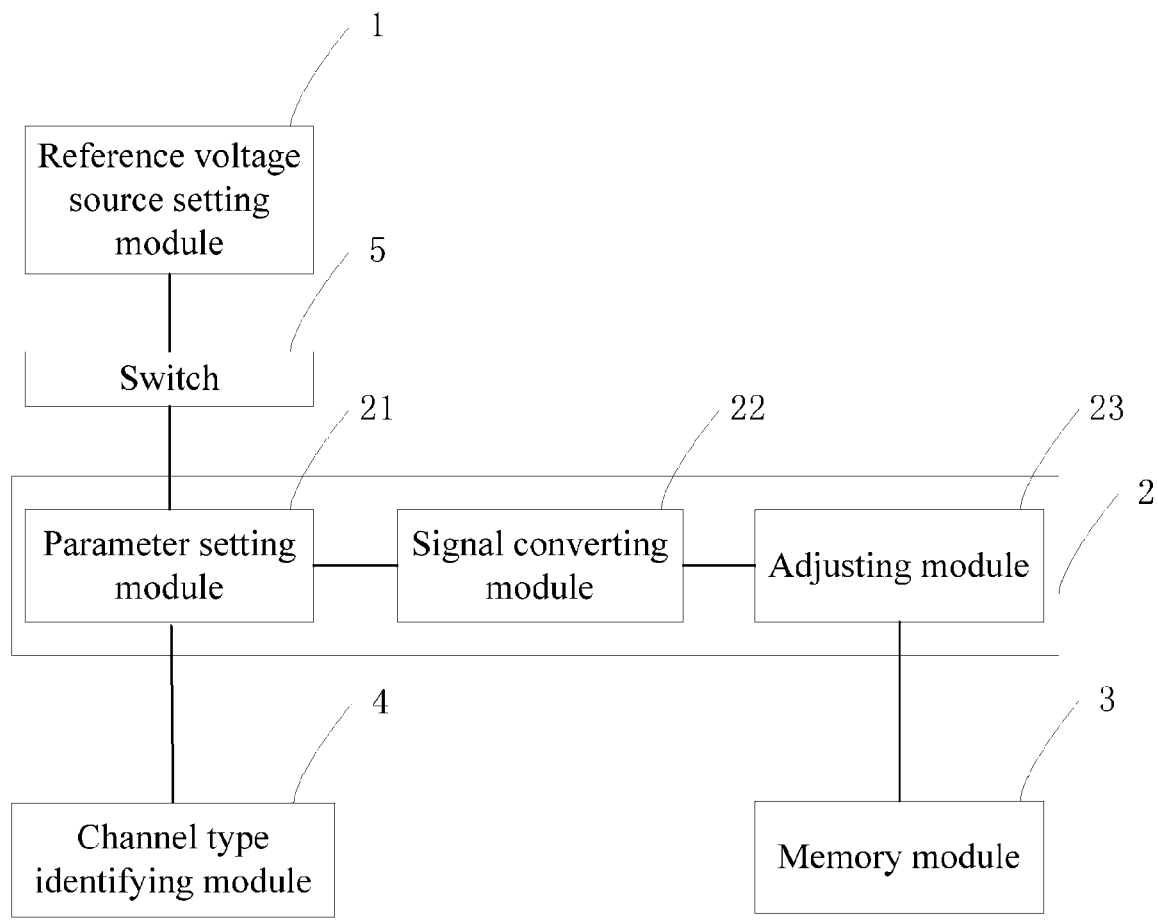
FIG. 8 is a block diagram showing a device for auto-calibration of ADC according to a third embodiment of the present invention.

Referring to FIG. 8, it is a block diagram showing a device for auto-calibration of ADC according to a third embodiment of the present invention.

In further embodiment, specifically, the adjusting module 23 is configured for acquiring the difference between the digital signal value and target value, and determining whether the difference is greater than the maximum of allowed margin of error when the absolute value of the difference is greater than the allowed margin of error, if yet, lessening the gain coefficient value, otherwise, increasing the gain coefficient value.

The device for auto-calibration of ADC further includes a channel type identifying module 4, which is connected to the parameter setting module 21.

The channel type identifying module 4 is configured for determining a channel type of an analog signal received by the ADC 2 and a calibration status when the ADC 2 is processing analog signal of said channel type.

In the embodiment of the present invention, if it is determined that the absolute value of the difference is smaller than the absolute value of the allowed margin of error, adjust to the gain coefficient value is terminated. For example, when the target value is 5, the digital signal value is 7, and the allowed margin of error is (−1, 1), the difference is 2, the absolute value of the difference is also 2, which is beyond the allowed margin of error and greater than the maximum of the allowed margin of error. In this case, the gain coefficient value should be lessened so that the digital signal value 7 gets close to the target value 5 so that the difference will be within the allowed margin of error. When the target value is 5, the digital signal value is 3, and the allowed margin of error is (−1, 1), the difference is −2, the absolute value of the difference is 2, which is beyond the allowed margin of error but smaller than the maximum of the allowed margin of error. In this case, the gain coefficient value should be increased so that the digital signal value 3 gets close to the target value 5 so that the difference will be within the allowed margin of error. Further, in the present embodiment, the gain coefficient value is selected to the adjusting subject, this simplifies the relation between the digital signal value and the voltage signal value and optimizes the program of the system.

In the embodiment of the present invention, the channel type can be one or more. Further, the number of the ADC that is processing the analog signal of the present channel type can be one or more, determined by actual need.

For different channel types of the analog signals need to be processed, the calibration to related parameters corresponding to each type of channel of the ADC is different.

For example, in television manufacturing field, the television includes a computer channel and a component channel. Each of the channels needs an ADC module which includes three independent ADCs for processing. Each of the ADCs of the ADC module has to be connected to a reference voltage source. That is, when the ADC module is processing the analog signal in the computer channel, each of the ADCs of the ADC module has to be calibrated, which is briefly called ADC calibration of the computer channel; and when processing the analog signal in the component channel, each of the ADCs of the ADC module has to be calibrated, which is briefly called ADC calibration of the component channel. The above two calibrations do not affect each other, however, after the two calibrations, analog signals in both the computer channel and component channel processed by the ADC module can produce substantially the same picture quality of picture in the computer channel and the component channel.

It should be point out that, during each calibration, the three ADCs of the ADC module are connected to an individual reference voltage source. That means, during each calibration, the three ADCs of the ADC module have to be calibrated. Parameters of each of the three ADCs are not necessarily the same as long as the ADC module can perform the goal and effect of calibration.

Figure 9:
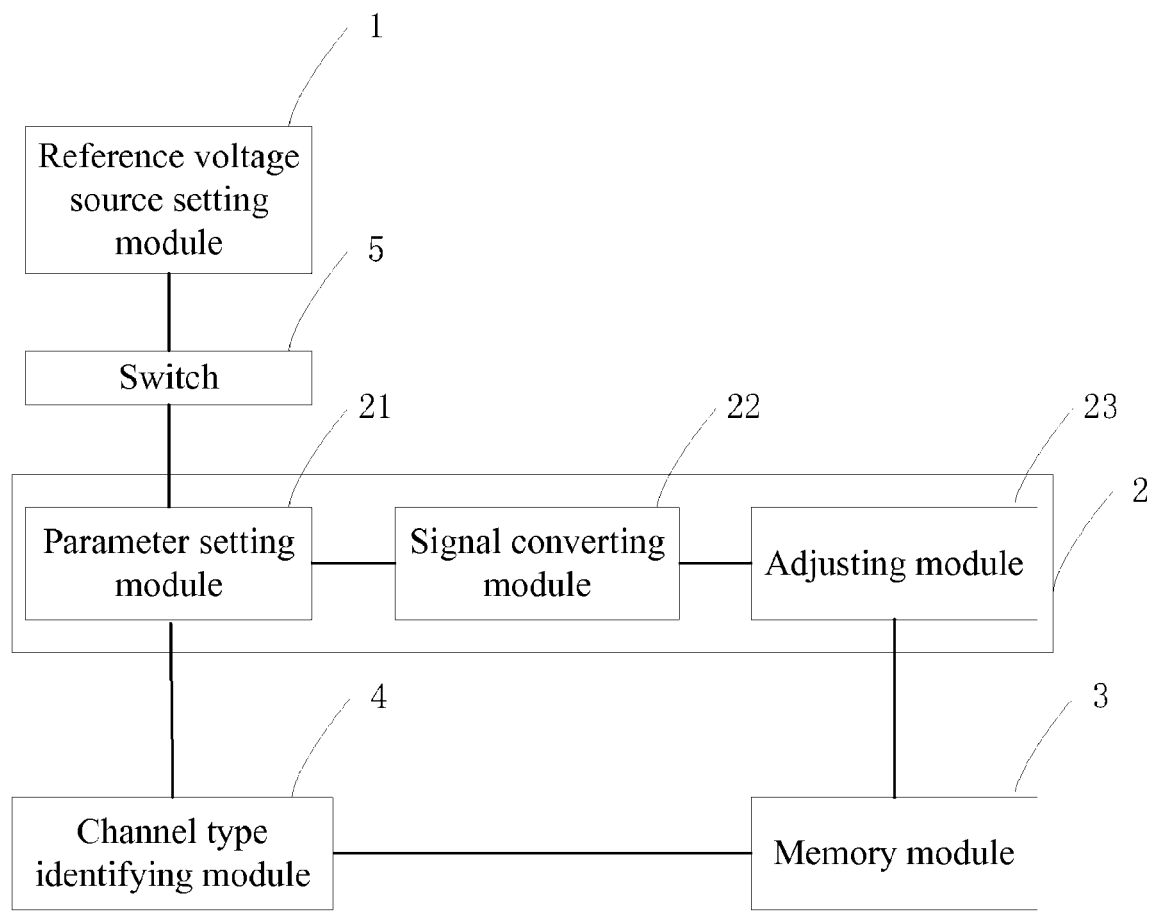
FIG. 9 is a block diagram showing a device for auto-calibration of ADC according to a fourth embodiment of the present invention.

Referring to FIG. 9, it is a block diagram showing a device for auto-calibration of ADC according to a fourth embodiment of the present invention.

In further embodiment, specifically, the memory module 3 is connected to the channel type adjusting module 4.

The memory module 3 is configure for arranging a specified position of a memory that corresponds to each channel type, and setting the value of 0 or 1 of the specified position to be a digital ID which corresponds to the status before and after calibration of the ADC when it is processing the analog signal in the current channel type.

The channel type adjusting module 4 is configure for reading the specified position of the memory and determining the current channel type according to the specified position; and reading the digital ID at the specified position and determining the calibration status of the ADC when it is processing the analog signal of the current channel type.

In the embodiment of the present invention, if the channel type includes channel type 1 and channel type 2, then a corresponding specified position 1 and specified position 2 are arranged in the memory. When the ADC is processing the analog signal of the channel type 1, if the ADC does not calibrate, the system sets the digital ID at the specified position 1 to be 0; and if the ADC has calibrated, the system sets the digital ID at the specified position 1 to be 1. Similarly, when the ADC is processing the analog signal of the channel type 2, if the ADC does not calibrate, the system sets the digital ID at the specified position 2 to be 0; and if the ADC has calibrated, the system sets the digital ID at the specified position 2 to be 1.

In practical application, the system should read the specified position of the memory in order. For example, the system reads the specified position 1 first and when it reads that the digital ID of the specified position 1 to be 0, the system determines that the ADC is not calibrated when it is processing the analog signal of the channel type 1. Then, according to the determining result, it is turned to step S2 to finish the calibration of the ADC. If the system reads the specified position 1 and it reads that the digital ID of the specified position 1 to be 1, the system determines that the ADC is calibrated when it is processing the analog signal of the channel type 1. After that, the system reads the next specified position 2 and reads the digital ID of the specified position 2. The following steps are similar to the above description of specified position 1 and will not be described again here.

In further embodiment, specifically, the memory module 3 is further configured for regenerating the digital ID at the specified position that corresponds to a current channel type, the regenerated digital ID corresponding to the status of the ADC which has been calibrated when it is processing the analog signal of the current channel type.

The memory module 3 is further configured for arranging a specified position of a memory that corresponds to each channel type; corresponding to current channel type, saving the adjusted gain coefficient value to the specified position of a memory, the gain coefficient value at the specified position being configured for being directly called during the digital conversion operation of the ADC.

In the embodiment of the present invention, if the ADC which is processing the analog signal of the channel type 1 has been calibrated, then the value 0 of the digital ID of the specified position 1 is set to be 1. If the system reads that the digital ID of the specified position is 1, it is then determined that when processing the analog signal of the channel type 1, the ADC has been calibrated. The system proceed to read the digital ID of the specified position 2, if the digital ID is 0, it means that when processing the analog signal of the channel type 2, the ADC has not been calibrated, the system then executes the steps S2 to S4. And further after the ADC has been calibrated when it is processing the analog signal of the channel type 2, the system sets the digital ID of the specified position 2 to be 1.

When the system has read that the value of the digital ID is 1 at all the specified positions 1 and 2, it means that the ADC has been calibrated.

In addition, as the ADC achieves the calibration by way of adjusting the gain coefficient value, it only needs to save the adjusted gain coefficient value at the specified position of the memory. When the system reads the specified position and the digital ID therein of the memory and determines that the ADC has been calibrated, the ADC calls the gain coefficient value at the specified position directed and finishes the digital signal conversion in corresponding channel type according to the gain coefficient value.

In practical application of the present invention, the channel type can be one or more, and the specified position set in the memory can also be one or more.

In the present embodiment, take television for example, the television includes a component channel and a computer channel. The memory provides a specified position 1 that corresponds to the component channel and a specified position 2 that corresponds to the computer channel. The value 0 and 1 of the specified position 1 correspond respectively to the non-calibrated and calibrated status of digital ID of the ADC when it processes analog signal of the component channel. The value 0 and 1 of the specified position 2 correspond respectively to the non-calibrated and calibrated status of digital ID of the ADC when it processes analog signal of the computer channel.

Compared to the defect of manual calibration of current ADC, the present invention has the following advantages: the procedure of the method for auto-calibration of ADC of the present invention is executed automatically, no professional operator is needed to calibrate manually. As such, labor cost is reduced and work efficiency is improved. The method for auto-calibration of ADC of the present invention is able to calibrate ADCs which process analog signals in multi-channel types, which makes it have a wide range of application and more practical. In the method for auto-calibration of ADC of the present invention, the digital signals gained from analog signals in different channel types processed by adjusted ADC are guaranteed to be substantially the same. The device for auto-calibration of ADC of the present invention has simple structure and is thus easy to be manufactured.

The above-mentioned is only preferred embodiments of the invention, and shall not be regarded as limitations of the patent range of the invention. All equivalent structures or flow transformations and modifications or direct or indirect applications.

What is claimed is:

1. A method for auto-calibration of ADC, comprising:
    acquiring a voltage signal value of a reference voltage source;
    converting the voltage signal value of the reference voltage source to a digital signal value according to a preset conversion coefficient value;
    comparing the digital signal value to a target value and adjusting the conversion coefficient value according to the comparing result so that the difference between the digital signal value and the target value is within an allowed margin of error;
    wherein the step of converting the voltage signal value of the reference voltage source to a digital signal value according to a preset conversion coefficient value specifically comprising:
    the preset conversion coefficient value including a bias coefficient value and a gain coefficient value, converting the voltage signal value of the reference voltage source to the digital signal value according to the bias coefficient value and gain coefficient value, the conversion relation between the digital signal value and the voltage signal value being: (digital signal value)=(voltage signal value)*(gain coefficient value)+(gain coefficient value); and
    adjusting the conversion coefficient value is specifically adjusting the gain coefficient value.

2. The method of claim 1, wherein after the step of comparing the digital signal value to a target value and adjusting the conversion coefficient value according to the comparing result so that the difference between the digital signal value and the target value is within an allowed margin of error, further comprises:
    saving the adjusted conversion coefficient value at a specified position of a memory, the adjusted conversion coefficient value being configured for being directly called during the digital conversion operation of the ADC.

3. The method of claim 2, wherein before the step of acquiring a voltage signal value of a reference voltage source, further comprises:
    determining a channel type of an analog signal received by the ADC and a calibration status when the ADC is processing analog signal of said channel type.

4. The method of claim 3, wherein the step of determining a channel type of an analog signal received by the ADC and a calibration status when the ADC is processing analog signal of said channel type comprises:
    arranging a specified position of a memory that corresponds to each channel type, and setting the value of 0 or 1 of the specified position to be a digital ID which corresponds to the status before and after calibration of the ADC when it is processing the analog signal in the current channel type; and
    reading the specified position of the memory and determining the current channel type according to the specified position; and reading the digital ID at the specified position and determining the calibration status of the ADC when it is processing the analog signal of the current channel type.

5. The method of claim 3, wherein before the step of saving the adjusted conversion coefficient value at a specified position of a memory, further comprises:
    regenerating the digital ID at the specified position that corresponds to a current channel type, the regenerated digital ID corresponding to the status of the ADC which has been calibrated when it is processing the analog signal of the current channel type.

6. The method of claim 3, wherein the step of saving the adjusted conversion coefficient value at a specified position of a memory comprises:
    arranging a specified position of a memory that corresponds to each channel type; corresponding to current channel type, saving the adjusted gain coefficient value to the specified position of a memory, the gain coefficient value at the specified position being configured for being directly called during the digital conversion operation of the ADC.

7. The method of claim 1, wherein the step of comparing the digital signal value to a target value and adjusting the conversion coefficient value according to the comparing result so that the difference between the digital signal value and the target value is within an allowed margin of error comprises:
    acquiring the difference between the digital signal value and target value; and
    determining whether the difference is greater than the maximum of allowed margin of error when the absolute value of the difference is greater than the absolute value of the allowed margin of error, if yet, lessening the gain coefficient value, otherwise, increasing the gain coefficient value.

8. A device for auto-calibration of ADC, comprising a reference voltage source setting module and a ADC, the ADC comprising a parameter setting module, a signal converting module, and an adjusting module, the reference voltage source setting module, parameter setting module, signal converting module, and adjusting module being connected to each other in serial, wherein
the reference voltage source setting module is configured for providing a reference voltage source to the ADC;
the parameter setting module is configured for presetting a conversion coefficient value, a target value and a allowed margin of error;
the signal converting module is configured for acquiring a voltage signal value of the reference voltage source and converting the voltage signal value of the reference voltage source to a digital signal value according to a preset conversion coefficient value;
The adjusting module is configured for comparing the digital signal value to the target value and adjusting the conversion coefficient value according to the comparing result so that the difference between the digital signal value and the target value is within the allowed margin of error.

9. The device of claim 8 further comprising a memory module connected to the adjusting module, wherein
the memory module is configured for saving the adjusted conversion coefficient value at a specified position thereof, the adjusted conversion coefficient value being configured for being directly called during the digital conversion operation of the ADC.

10. The device of claim 9 further comprises a channel type identifying module which is connected to the parameter setting module, wherein
the channel type identifying module is configured for determining a channel type of an analog signal received by the ADC and a calibration status when the ADC is processing analog signal of said channel type.

11. The device of claim 10, wherein
the memory module is connected to the channel type adjusting module;
the memory module is configure for arranging a specified position of a memory that corresponds to each channel type, and setting the value of 0 or 1 of the specified position to be a digital ID which corresponds to the status before and after calibration of the ADC when it is processing the analog signal in the current channel type; and the channel type adjusting module is configure for reading the specified position of the memory and determining the current channel type according to the specified position; and reading the digital ID at the specified position and determining the calibration status of the ADC when it is processing the analog signal of the current channel type.

12. The device of claim 10, wherein the memory module is further configured for regenerating the digital ID at the specified position that corresponds to a current channel type, the regenerated digital ID corresponding to the status of the ADC which has been calibrated when it is processing the analog signal of the current channel type.

13. The device of claim 10, wherein the memory module is further configured for arranging a specified position of a memory that corresponds to each channel type;
corresponding to current channel type, saving the adjusted gain coefficient value to the specified position of a memory, the gain coefficient value at the specified position being configured for being directly called during the digital conversion operation of the ADC.

14. The device of claim 8, wherein the adjusting module is configured for presetting the bias coefficient value and gain coefficient value of the conversion coefficient value;
the signal converting module is configure for converting the voltage signal value of the reference voltage source setting module to the digital signal value according to the bias coefficient value and gain coefficient value, the conversion relation between the digital signal value and the voltage signal value being: (digital signal value)= (voltage signal value)*(gain coefficient value)+(gain coefficient value); and
the adjusting module adjusting the conversion coefficient specifically comprises adjusting the gain coefficient value.

15. The device of claim 14, wherein the adjusting module is configure for acquiring the difference between the digital signal value and target value; and determining whether the difference is greater than the maximum of allowed margin of error when the absolute value of the difference is greater than the absolute value of the allowed margin of error, if yet, lessening the gain coefficient value, otherwise, increasing the gain coefficient value.

* * * * *